US012568604B2

(12) United States Patent
Sun et al.

(10) Patent No.: US 12,568,604 B2
(45) Date of Patent: Mar. 3, 2026

(54) NODE AND ELECTRONIC DEVICE

(71) Applicant: HUAWEI TECHNOLOGIES CO., LTD., Guangdong (CN)

(72) Inventors: Xiaoguang Sun, Dongguan (CN); Junen Gao, Dongguan (CN); Huan Peng, Dongguan (CN)

(73) Assignee: Huawei Technologies Co., LTD., Shenzhen (CN)

( * ) Notice: Subject to any disclaimer, the term of this patent is extended or adjusted under 35 U.S.C. 154(b) by 249 days.

(21) Appl. No.: 18/185,861

(22) Filed: Mar. 17, 2023

(65) Prior Publication Data

US 2023/0225078 A1 Jul. 13, 2023

Related U.S. Application Data

(63) Continuation of application No. PCT/CN2021/117846, filed on Sep. 11, 2021.

(30) Foreign Application Priority Data

Sep. 21, 2020 (CN) .......................... 202010994533.1

(51) Int. Cl.
*H05K 7/20* (2006.01)
*G01M 3/18* (2006.01)
(Continued)

(52) U.S. Cl.
CPC ........ *H05K 7/20272* (2013.01); *G01M 3/182* (2013.01); *H05K 1/0203* (2013.01);
(Continued)

(58) Field of Classification Search
None
See application file for complete search history.

(56) References Cited

U.S. PATENT DOCUMENTS 8,760,855 B2 * 6/2014 Howes ............... H05K 7/20936
361/677
10,638,645 B1 * 4/2020 Moen ................... G21C 15/182
(Continued)

FOREIGN PATENT DOCUMENTS

CN 106527637 A 3/2017
CN 110121249 A 8/2019

OTHER PUBLICATIONS

International Search Report and Written Opinion in International Appln. No. PCT/CN2021/117846, mailed on Nov. 22, 2021, 17 pages (with English translation).

*Primary Examiner* — Courtney L Smith
(74) *Attorney, Agent, or Firm* — Fish & Richardson P.C.

(57) ABSTRACT

The present disclosure relates to heat dissipation apparatuses. In an example, a node includes a structural module, a circuit board, a liquid pipe, and a liquid leakage monitoring apparatus. The circuit board is securely mounted on the structural module, and an electronic component including a chip is disposed on the circuit board. The liquid pipe is disposed on the circuit board, and is configured to dissipate heat for the electronic component on the circuit board. The liquid leakage monitoring apparatus includes a drainage pipe sleeved outside the liquid pipe. There is a specific gap between the drainage pipe and the liquid pipe. In response to at least that leakage occurs in the liquid pipe, leaked coolant flows in the drainage pipe.

20 Claims, 6 Drawing Sheets

(51) Int. Cl.
    *H05K 1/02*           (2006.01)
    *F16L 55/00*         (2006.01)
    *F16L 55/07*         (2006.01)

(52) U.S. Cl.
    CPC .............. *F16L 55/00* (2013.01); *F16L 55/07*
              (2013.01); *H05K 2201/064* (2013.01)

(56)                References Cited

U.S. PATENT DOCUMENTS

| | | | |
|---|---|---|---|
| 11,199,466 B2 * | 12/2021 | Chen ................. | H01L 21/67017 |
| 11,219,142 B2 * | 1/2022 | Chen ................. | H05K 7/20781 |
| 11,310,938 B2 * | 4/2022 | Su ......................... | G01M 3/183 |
| 12,082,371 B2 * | 9/2024 | Isoya ................... | H01L 23/473 |
| 2007/0157705 A1 * | 7/2007 | Bilstad ................. | G01M 3/283 |
| | | | 73/49.1 |
| 2009/0284004 A1 * | 11/2009 | Simmons ............. | F16L 39/005 |
| | | | 403/3 |
| 2011/0313576 A1 * | 12/2011 | Nicewonger ...... | H05K 7/20781 |
| | | | 361/701 |
| 2017/0175943 A1 * | 6/2017 | Burdette ................. | F16L 57/02 |
| 2019/0239386 A1 * | 8/2019 | Chen ................. | H05K 7/20763 |
| 2020/0340767 A1 * | 10/2020 | Holden ............. | H05K 7/20254 |

* cited by examiner

231(230)          241(240)

243(240)

242(240)

231(230)          241(240)

242(240)

NODE AND ELECTRONIC DEVICE

CROSS-REFERENCE TO RELATED APPLICATIONS

This application is a continuation of International Patent Application No. PCT/CN2021/117846, filed on Sep. 11, 2021, which claims priority to Chinese Patent Application No. 202010994533.1, filed on Sep. 21, 2020. The disclosures of the aforementioned applications are hereby incorporated by reference in their entireties.

TECHNICAL FIELD

This application relates to the field of server technologies, and in particular, to a node and an electronic device.

BACKGROUND

With advent of an artificial intelligence era, chip power consumption increases faster with improvement of chip capabilities, and this imposes a higher requirement on a heat dissipation capability of a chip. Because a liquid cooling heat dissipation apparatus provides a good heat dissipation effect, liquid cooling is increasingly used as an important means for heat dissipation of a chip. However, for a technical means of liquid cooling heat dissipation, a liquid leakage monitoring apparatus needs to be disposed to monitor whether liquid leakage occurs in a liquid pipe of the liquid cooling heat dissipation apparatus, to prevent coolant leaked from the liquid pipe from damaging an electronic component.

In the conventional technology, the liquid leakage monitoring apparatus includes a monitoring rope. The monitoring rope is fastened to the liquid pipe. When coolant leaked from the liquid pipe flows to the monitoring rope, the liquid leakage monitoring apparatus sends alarm signal information. In this technical solution, it is difficult for the monitoring rope to reach 100% coverage, and monitoring timeliness is poor. In addition, after the liquid leakage occurs in the liquid pipe, the coolant from the liquid pipe flows through a node. If this problem is not resolved in a timely manner, the coolant spreads to an entire server or another node in an electronic device, and causes damage to a plurality of nodes.

SUMMARY

This application provides a node and an electronic device, to improve coverage of a liquid leakage monitoring apparatus for a liquid pipe, and improve monitoring timeliness. In addition, this application can reduce spreading of leaked coolant, to protect the node and the electronic device, and reduce a loss caused by leakage of the liquid pipe.

According to a first aspect, this application provides a node. The node includes a structural module, a circuit board, a liquid pipe, and a liquid leakage monitoring apparatus. The circuit board is securely mounted on the structural module, and an electronic component including a chip is disposed on the circuit board. The liquid pipe is disposed on the circuit board, and is configured to dissipate heat for the electronic component on the circuit board. The liquid leakage monitoring apparatus is configured to monitor whether liquid leakage occurs in the liquid pipe. Specifically, the liquid leakage monitoring apparatus includes a drainage pipe sleeved outside the liquid pipe. There is a specific gap between the drainage pipe and the liquid pipe. When leakage occurs in the liquid pipe, leaked coolant flows in the drainage pipe, and does not flow randomly, to prevent a problem such as a short circuit on the circuit board. The drainage pipe is connected to a liquid receiving tray, and the leaked coolant flows through the drainage pipe into the liquid receiving tray. A first liquid leakage sensor is disposed in the liquid receiving tray. When detecting that there is leaked coolant in the liquid receiving tray, the first liquid leakage sensor sends an alarm signal, so that a system or an operator can store data or cut off power supply. In this solution, leakage at any location in the liquid pipe can be detected in a timely manner, and the leaked coolant is not likely to flow randomly on the circuit board. In a word, this solution can reduce a loss caused by leakage of the liquid pipe.

A form of the alarm signal sent by the liquid leakage monitoring apparatus is not limited. For example, the alarm signal may be at least one of a buzzer, an indicator, a pop-up window in a display interface, or a blinking window in a display interface. The buzzer and the indicator may be disposed in an area in which the electronic device is located, or may be disposed in a control room, so that the operator receives the alarm signal as soon as possible. In this solution, after obtaining the alarm signal, the operator needs to handle the leakage of the liquid pipe in a timely manner, for example, close a valve of the liquid pipe, cut off power supply of the node, and maintain the node.

Alternatively, the alarm signal may be a control message or an indication message. The node may further include a first controller. The liquid pipe has a switch valve. The first controller is connected to the switch valve and the first liquid leakage sensor. After receiving the alarm signal sent by the first liquid leakage sensor, the first controller controls the switch valve to close, in other words, cuts off coolant supply of the liquid pipe. In this way, the liquid leakage of the liquid pipe is handled as soon as possible, and the loss is controlled to a small extent.

A specific type of the first liquid leakage sensor is not limited, and may be a point-type liquid leakage sensor or a rope-type liquid leakage sensor. This is not limited in this application.

When the liquid receiving tray is specifically disposed, the liquid leakage monitoring apparatus may include a plurality of liquid receiving trays, and a drainage pipe of a specified length is connected between adjacent liquid receiving trays. In other words, one liquid receiving tray is disposed between drainage pipes at a spacing of a specified length. In this way, coolant leaked from the liquid pipe may quickly flow into the liquid receiving tray, so that the first liquid leakage sensor can detect the coolant in a short time and respond as soon as possible. This can improve a response speed when the leakage occurs in the liquid pipe.

The liquid receiving tray may be specifically disposed at a corner of the drainage pipe. Therefore, only a straight-line drainage pipe is needed. It is convenient to install and prepare the drainage pipe. In addition, the liquid receiving tray may be further disposed at a connection between two adjacent drainage pipes. In this way, the two adjacent drainage pipes do not need another connection structure, provided that the two adjacent drainage pipes are connected to the liquid receiving tray. Installation and maintenance are convenient. Moreover, for the drainage pipe, the corner and the connection are prone to damage. This solution can further improve structural reliability of the drainage pipe, so that leakage is unlikely to occur in the drainage pipe.

In a technical solution, the node may further include a liquid isolation area. The liquid isolation area is located at an edge of the node, may avoid the circuit board of the node. The liquid isolation area is used to collect the leaked coolant, and isolate the leaked coolant from the circuit board. Specifically, a liquid guide opening is disposed on a side that is of the liquid isolation area and that faces the liquid leakage monitoring apparatus. When more and more coolant leaks from the liquid pipe, the leaked coolant can flow into the liquid isolation area through the liquid guide opening. This solution can reduce impact of the leaked coolant on a current node, and the leaked coolant does not flow in an electronic device in which the node is located, so that an electronic component in another area of the electronic device is not damaged due to the impact of the leaked coolant.

A liquid guide groove is also disposed between the liquid receiving tray and the liquid guide opening of the liquid isolation area. The leaked coolant in the liquid receiving tray may flow into the liquid isolation area through the liquid guide groove. The liquid guide groove is disposed, so that a case in which the leaked coolant flows randomly on the circuit board can be reduced. This can reduce damage caused by the leaked coolant to an electronic component on the circuit board.

After flowing from the drainage pipe into the liquid receiving tray, the leaked coolant may directly flow from the liquid guide groove into the liquid isolation area, but the first liquid leakage sensor does not detect the leakage. In this case, it is difficult for a user to detect the leakage in the liquid pipe in a timely manner. Therefore, a detection area of the first liquid leakage sensor may be arranged at a connection between the liquid receiving tray and the liquid guide groove. Therefore, when flowing from the liquid receiving tray to the liquid guide groove, the leaked coolant definitely passes through the detection area of the first liquid leakage sensor, so that the first liquid leakage sensor can send the alarm signal in time and accurately.

In addition, a liquid guide pipe may be disposed between the liquid receiving tray and the liquid guide opening of the liquid isolation area. The leaked coolant in the liquid receiving tray is introduced into the liquid isolation area through the liquid guide pipe. In this solution, the leaked coolant in the liquid guide pipe does not overflow to the circuit board. Therefore, the structure is more reliable.

In this solution, an upper cover may be further disposed on the liquid receiving tray. After the leakage occurs in the liquid pipe, the leaked coolant flows into the liquid isolation area through the drainage pipe, the liquid receiving tray, and the liquid guide pipe in sequence, but does not flow to the circuit board. Therefore, this solution has a good protection effect for the electronic component on the circuit board.

In this solution, a detection area of the first liquid leakage sensor may also be arranged at a connection between the liquid receiving tray and the liquid guide pipe, to ensure that when the coolant leakage occurs, the first liquid leakage sensor can detect the leaked coolant and send an alarm signal.

The liquid isolation area may further include a liquid outlet, and the leaked coolant in the liquid isolation area may flow out of the liquid outlet. In this way, the leaked coolant flows out of the liquid isolation area in a directional manner, and the leaked coolant in the liquid isolation area neither overflows nor flows to another node.

A second liquid leakage sensor may further be disposed in the liquid isolation area. When there is leaked coolant in the liquid isolation area, the second liquid leakage sensor may send an alarm signal. In this way, the system or the user may learn of a current leakage degree of the liquid pipe as soon as possible, even if the first liquid leakage sensor does not send the alarm signal. This can implement multi-level monitoring and improve reliability of monitoring the liquid pipe leakage by the node.

In a technical solution, the node further includes a power board, configured to supply power to the liquid leakage monitoring apparatus. The power board may be specifically configured to supply power to the first liquid leakage sensor and the second liquid leakage sensor. To protect the power board, the node further includes a liquid leakage protection area. The power board is disposed in the liquid leakage protection area. There is a partition board in the liquid leakage protection area, so that the power board is isolated from another area. Therefore, even if a large amount of coolant leaks, the power board can still work normally, to ensure that the liquid leakage monitoring apparatus works normally.

When the liquid receiving tray is installed, the liquid receiving tray may be detachably installed on the drainage pipe. The detachable installation may be screw installation, clamping, bolt connection, or the like, to facilitate installation and removal of the liquid receiving tray.

According to a second aspect, this application further provides an electronic device. The electronic device includes a cabinet body and a node disposed in the cabinet body. The node is the node in any one of the foregoing technical solutions. The electronic device in this solution is unlikely affected by leakage of a liquid pipe, and can find and handle a leakage problem of the liquid pipe in a timely manner.

The electronic device further includes a liquid discharge pipe. The node includes a liquid isolation area, and a liquid outlet of the liquid isolation area is connected to the liquid discharge pipe. Therefore, when the leakage occurs in the liquid pipe at any node, the liquid discharge pipe may be configured to discharge leaked coolant out of the cabinet body of the electronic device without flowing inside the cabinet body. This can reduce impact on another node.

The liquid discharge pipe is further connected to a liquid collection tray. The liquid collection tray collects the coolant leaked from the liquid discharge pipe, so that the leaked coolant does not flow randomly in an equipment room. In addition, a third liquid leakage sensor is further disposed in the liquid collection tray. When detecting that there is leaked coolant in the liquid collection tray, the third liquid leakage sensor may send an alarm signal. In this way, a system or a user may learn of a current leakage degree of the liquid pipe as soon as possible, to prevent a case in which a first liquid leakage sensor and a second liquid leakage sensor do not send alarm signals. This can implement multi-level monitoring and improve reliability of monitoring the liquid pipe leakage by the node.

The electronic device further includes a second controller. The liquid pipe is connected to a switch valve. The second controller is connected to the switch valve and the third liquid leakage sensor. When detecting that the liquid leakage occurs, the third liquid leakage sensor sends the alarm signal, and the second controller may control, based on the alarm signal sent by the third liquid leakage sensor, the switch valve to close. In this solution, the second controller may be configured to automatically cut off coolant transmission.

REFERENCE NUMERALS

Figure 1:
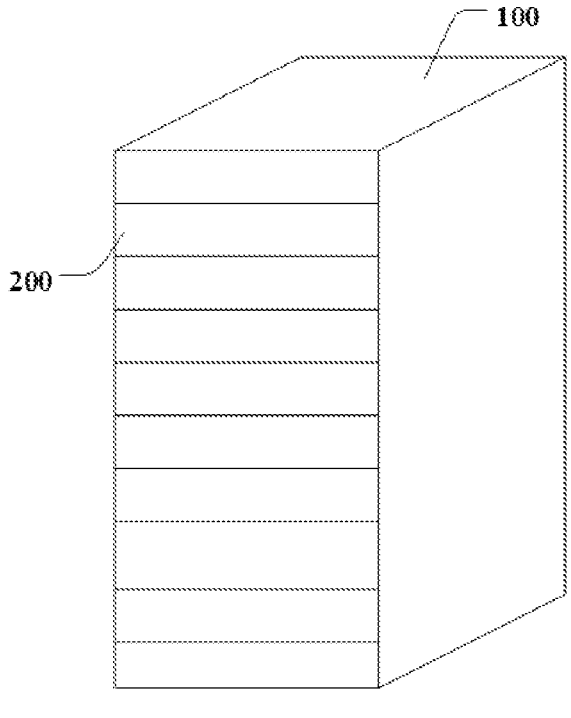
FIG. 1 is a schematic diagram of a structure of an electronic device according to an embodiment of this application.

| | |
|---|---|
| 100-Cabinetbody; | 200-Node; |
| 210-Structural module; | 220-Circuit board; |
| 230-Liquid cooling heat dissipation apparatus; | 231-Liquid pipe; |
| 232-Liquid inlet pipe; | 233-Liquid outlet pipe; |
| 234-Cold plate; | 240-Liquid leakage monitoring apparatus; |
| 241-Drainage pipe; | 242-Liquid receiving tray; |
| 243-First liquid leakage sensor; | 244-Power board; |
| 250-Liquid isolation area; | 251-Liquid guide opening; |
| 252-Second liquid leakage sensor; | 253-Liquid outlet; |
| 260-Liquid guide groove; | 270-Liquid leakage protection area: |
| 300-Liquid discharge pipe; | 400-Liquid collection tray; |
| 410-Third liquid leakage sensor. | |

DESCRIPTION OF EMBODIMENTS

Terms used in the following embodiments are only intended to describe specific embodiments, but are not intended to limit this application. The terms "one", "a" and "this" of singular forms used in this specification and the appended claims of this application are also intended to include expressions such as "one or more", unless otherwise specified in the context clearly.

Reference to "an embodiment", "a specific embodiment", or the like described in this specification indicates that one or more embodiments of this application include a specific feature, structure, or characteristic described with reference to the embodiments. The terms "include", "comprise", "have", and their variants all mean "include but are not limited to", unless otherwise specifically emphasized in another manner.

For ease of understanding a node and an electronic device provided in embodiments of this application, the following first describes an application scenario of the node and the electronic device. The electronic device in this application may be a computing device (for example, a server), a network device (for example, a switch), a storage device (for example, a storage array), or the like. The electronic device may include a cabinet body and a node disposed in the cabinet body. The node includes a circuit board, and a plurality of electronic components are disposed on the circuit board, to implement a function of the node. As functions of the electronic device become more abundant, the electronic component disposed on the circuit board of the node, for example, a chip, also has higher power, and generates more heat. To dissipate heat for a heated electronic component, a liquid cooling heat dissipation apparatus is also disposed on the node. There is coolant in a liquid pipe of the liquid cooling heat dissipation apparatus, so that heat can be dissipated for the heated electronic component. The liquid pipe of the liquid cooling heat dissipation apparatus is prone to liquid leakage. If the liquid leakage occurs, the coolant in the liquid pipe may damage the node. If this problem is not resolved in a timely manner, an entire electronic device may be damaged. Therefore, this application provides a node disposed with a liquid leakage monitoring apparatus and a server. To make the objectives, technical solutions, and advantages of this application clearer, the following further describes this application in detail with reference to the accompanying drawings.

Figure 2:
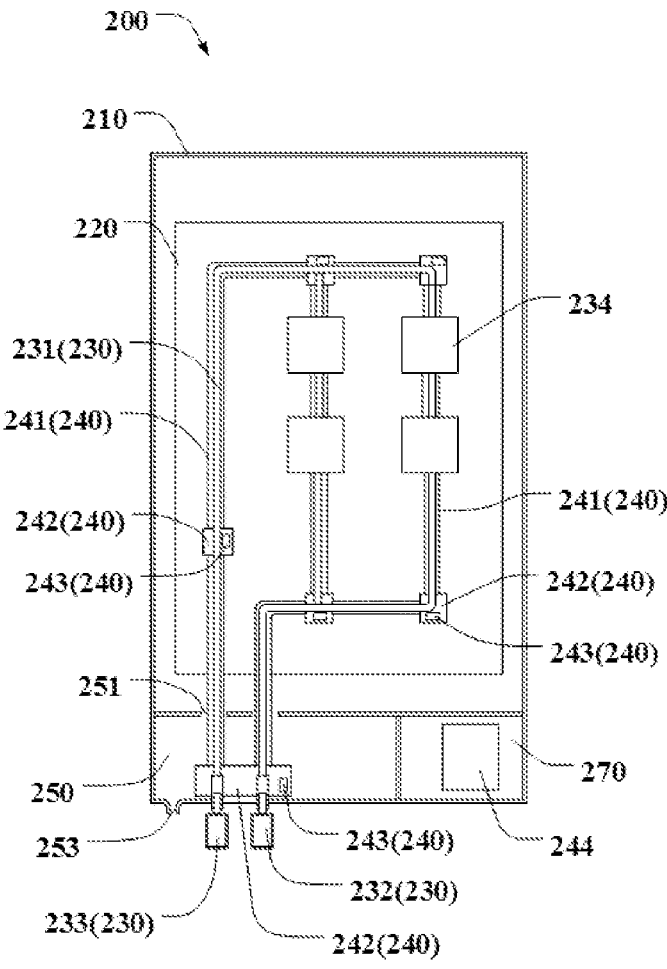
FIG. 2 is a schematic diagram of a structure of a node according to an embodiment of this application.
Figure 3:
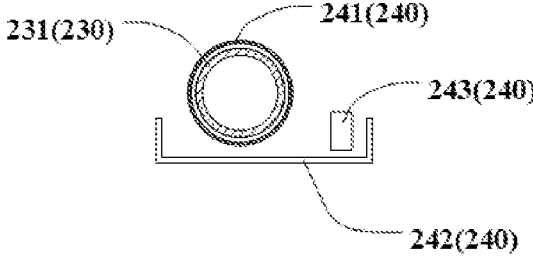
FIG. 3 is a schematic diagram of a cross-sectional structure in which a drainage pipe is connected to a liquid receiving tray according to an embodiment of this application.

FIG. 1 is a schematic diagram of a structure of an electronic device according to an embodiment of this application. As shown in FIG. 1, the electronic device includes a cabinet body 100 and a plurality of nodes 200 disposed in the cabinet body 100. FIG. 2 is a schematic diagram of a structure of a node according to an embodiment of this application. As shown in FIG. 2, the node 200 includes a structural module 210 and a circuit board 220 fastened to the structural module 210. The circuit board 220 is disposed with an electronic component. The electronic component includes a chip. As a core component of the node 200, the chip generates a large amount of heat. A liquid cooling heat dissipation apparatus 230 is also disposed on the node 200, configured to dissipate heat for an electronic component that generates a large amount of heat in the node 200, for example, dissipate heat for the chip. The liquid cooling heat dissipation apparatus 230 includes a liquid pipe 231, and a cold plate 234 connected to the liquid pipe 231. There is coolant in the liquid pipe 231 and the cold plate 234, which is used to dissipate heat for the electronic component. A liquid leakage monitoring apparatus 240 is also disposed on the node 200, configured to monitor whether leakage occurs in the liquid pipe 231. Specifically, the liquid leakage monitoring apparatus 240 includes a drainage pipe 241. The drainage pipe 241 is sleeved outside the liquid pipe 231. There is a specific gap between the drainage pipe 241 and the liquid pipe 231. When leakage occurs in the liquid pipe 231, leaked coolant flows into the gap between the liquid pipe 231 and the drainage pipe 241, and does not directly flow to the circuit board 220. FIG. 3 is a schematic diagram of a cross-sectional structure of the drainage pipe and the liquid receiving tray according to an embodiment of this application. Refer to FIG. 2 and FIG. 3. The drainage pipe 241 is connected to the liquid receiving tray 242. The leaked coolant flows into the liquid receiving tray 242 after flowing through the drainage pipe 241. A first liquid leakage sensor 243 is disposed in the liquid receiving tray 242. When detecting that there is leaked coolant, the first liquid leakage sensor 243 sends an alarm signal.

The circuit board 220 may encounter a problem such as a short circuit when contacting liquid, so that the node 200 to be unable to work normally. When there is coolant in the liquid pipe 231, leakage may occur. In this embodiment of this application, the liquid leakage monitoring apparatus 240 provides a timely and accurate monitoring effect. Once the leakage occurs at any location in the liquid pipe 231, the leaked coolant definitely flows through the drainage pipe 241 into the liquid receiving tray 242. Then the first liquid leakage sensor 243 detects the leaked coolant, and triggers the alarm signal. Therefore, the liquid leakage monitoring apparatus 240 provides high monitoring coverage. In addition, when the liquid leakage occurs, the leaked coolant flows through the drainage pipe 241 into the liquid receiving tray 242, rather than directly flowing to the circuit board 220. The alarm signal is first triggered, so that a system or a worker handles the leaked coolant in a timely manner, for example, store data and cut off power supply, to reduce a loss caused by leakage of the liquid pipe 231.

The cold plate 234 may cover a surface of the electronic component, and directly contact the surface of the electronic component or contact the surface of the electronic component by using a heat exchange layer. In this way, the cold plate 234 has a large heat exchange area with the electronic component, to improve heat dissipation efficiency of the electronic component. A heat exchange fin may be further disposed in an inner cavity of the cold plate 234, to improve heat exchange efficiency of the cooling water.

It should be noted that, in this embodiment of this application, the node may be directly installed in the cabinet body of the electronic device. For example, the electronic device may be a switch, a router, or a rack server. Alternatively, the node may be installed in a frame, and then the node is installed in the cabinet body of the electronic device by using the frame. For example, the electronic device may be a blade server. When the node is installed in the cabinet body by using the frame, one or more nodes may be installed on each frame. This is not limited in this application.

In a specific embodiment, the liquid leakage sensor may be a point-type liquid leakage sensor, or may be a rope-type liquid leakage sensor. This is not limited in this application. When the liquid leakage sensor is a point-type liquid leakage sensor, an optical device may be configured to monitor whether there is leaked coolant. When the liquid leakage sensor is a rope-type liquid leakage sensor, conductivity of the coolant may be used to monitor whether there is leaked coolant. In addition, the rope-type liquid leakage sensor can provide a larger arrangement scope for a monitoring rope, and improve coverage of the liquid leakage sensor.

In addition to the liquid pipe 231, the liquid cooling heat dissipation apparatus 230 further includes a liquid inlet pipe 232 and a liquid outlet pipe 233. The liquid inlet pipe is connected to a water pump (not shown). Driven by the water pump, the coolant flows from the liquid inlet pipe 232 to the liquid pipe 231, and exchanges heat with the electronic component on the circuit board 220 when flowing in the liquid pipe 231. A temperature of the coolant increases and the coolant flows out of the liquid outlet pipe 233. After exchanging heat outside, the coolant cools, and then flows through the liquid inlet pipe 232 into the liquid pipe 231. In this way, circulation is performed.

A form of the alarm signal sent by the liquid leakage monitoring apparatus is not limited. The alarm signal may be a control signal or an indication signal. When the alarm signal is an indication signal, the alarm signal is an alarm signal sent to an operator. After receiving the alarm signal, the operator needs to actively handle a leakage accident of the liquid pipe. When the alarm signal is a control signal, the alarm signal is an alarm signal sent to the first controller. The first controller controls, based on the alarm signal, the liquid pipe to cut off coolant supply, or may further save node data and/or cut off power supply of the node, to reduce a loss.

For example, in an embodiment, the alarm signal may be at least one of a buzzer, an indicator, a pop-up window in a display interface, or a blinking window in a display interface. The buzzer and the indicator may be disposed in an area in which the electronic device is located, or may be disposed in a control room, so that the operator receives the alarm signal as soon as possible. In this solution, after obtaining the alarm signal, the operator needs to handle the leakage of the liquid pipe in a timely manner, for example, close a valve of the liquid pipe, power off the node, and maintain the node.

In another embodiment, the node may further include the first controller, and the liquid pipe has a switch valve. Specifically, the switch valve is located at an end that is of the liquid pipe and that faces the liquid inlet pipe. The first controller is connected to the switch valve and the first liquid leakage sensor. After receiving the alarm signal sent by the first liquid leakage sensor, the first controller controls the switch valve to close, in other words, cuts off coolant supply of the liquid pipe. In this way, the liquid leakage of the liquid pipe is handled as soon as possible, the coolant leaked from the liquid pipe is decreased, and the loss is controlled to a small extent.

When the liquid receiving tray 242 is specifically disposed, each liquid leakage monitoring apparatus 240 may include a plurality of liquid receiving trays 242, and a drainage pipe 241 is connected between two adjacent liquid receiving trays 242. Specifically, the drainage pipe 241 between the two adjacent liquid receiving trays 242 has a specific length. A longer distance between the liquid receiving tray 242 and a leakage location of the liquid pipe 231 indicates that the liquid receiving tray 242 can collect the leaked coolant later after the leakage of the liquid pipe 231, and the liquid leakage monitoring apparatus 240 has poorer timeliness in monitoring the leakage of the liquid pipe 231. Therefore, there is a liquid receiving tray 242 on each of two ends of the drainage pipe 241 of a specific length. When the liquid leakage occurs, the leaked coolant may flow into the liquid receiving tray 242 quickly, so that the liquid leakage monitoring apparatus 240 may monitor the liquid leakage in a timely manner.

Still refer to FIG. 2. The liquid receiving tray 242 may be disposed at a corner of the drainage pipe 241, so that when the drainage pipe 241 is prepared and installed, only a straight-line drainage pipe 241 is needed, and the drainage pipe 241 is disposed only outside a straight-line section of the liquid pipe 231. It is convenient to install and prepare the drainage pipe 241. In addition, the liquid receiving tray 242 may be further disposed at a connection between two adjacent drainage pipes 241, and the drainage pipes 241 do not need to be connected. Therefore, an installation process is convenient. In addition, a structure of the drainage pipe 241 provides high reliability, and the leakage of the drainage pipe 241 is not likely to occur.

Figure 4:
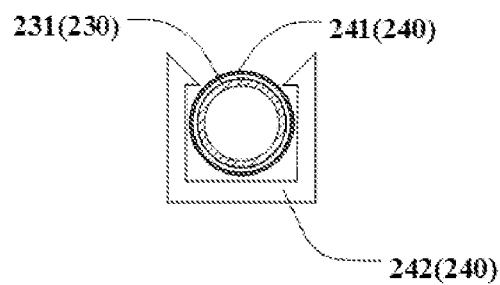
FIG. 4 is a schematic diagram of a connection between a liquid receiving tray and a drainage pipe according to an embodiment of this application.

Specifically, when the liquid receiving tray 242 is installed, the liquid receiving tray 242 may be detachably installed on the drainage pipe 241, for example, installed through screw installation, bolt installation, or clamping. This is not specifically limited in this application. A detachable installation manner is used, to facilitate arrangement of the drainage pipe 241 and the liquid receiving tray 242. This provides more flexible configuration, and facilitates changing an installation location and the like. FIG. 4 is a schematic diagram of a connection between the liquid receiving tray 242 and the drainage pipe 241 according to an embodiment of this application. As shown in FIG. 4, the liquid receiving tray 242 is clamped to the drainage pipe 241. A clamping connection manner facilitates installation and removal of the liquid receiving tray 242, and an operation process is simple. Certainly, in another embodiment, the liquid receiving tray may be further disposed on the circuit board of the node, and may be detachably installed on the circuit board or may be undetachably fastened to the circuit board. This is not limited in this application.

Still refer to FIG. 2. The node 200 further includes a liquid isolation area 250. Specifically, the liquid isolation area 250 may be located at a side edge of the node 200 and avoid the circuit board 220. Alternatively, the liquid isolation area 250 avoids any electronic component, so that the liquid isolation area 250 collects the leaked coolant, to reduce impact on the electronic component of the node 200. Certainly, the liquid isolation area 250 may alternatively avoid only an important electronic component of the node 200, and may be specifically designed based on an actual product structure and a requirement. There is a liquid guide opening 251 in the liquid isolation area 250. The liquid guide opening 251 is disposed on a side that is of the liquid isolation area 250 and that faces the liquid leakage monitoring apparatus 240. Alternatively, the liquid guide opening 251 is located on a side that is of the liquid isolation area 250 and that faces the circuit board. In conclusion, when the leakage occurs in the liquid pipe 231 of the liquid cooling heat dissipation apparatus 230, the leaked coolant may flow into the liquid isolation area 250 through the liquid guide opening 251. To facilitate the leaked coolant flowing into the liquid isolation area 250, the liquid guide opening 251 may have a slope guide structure.

Figure 5:
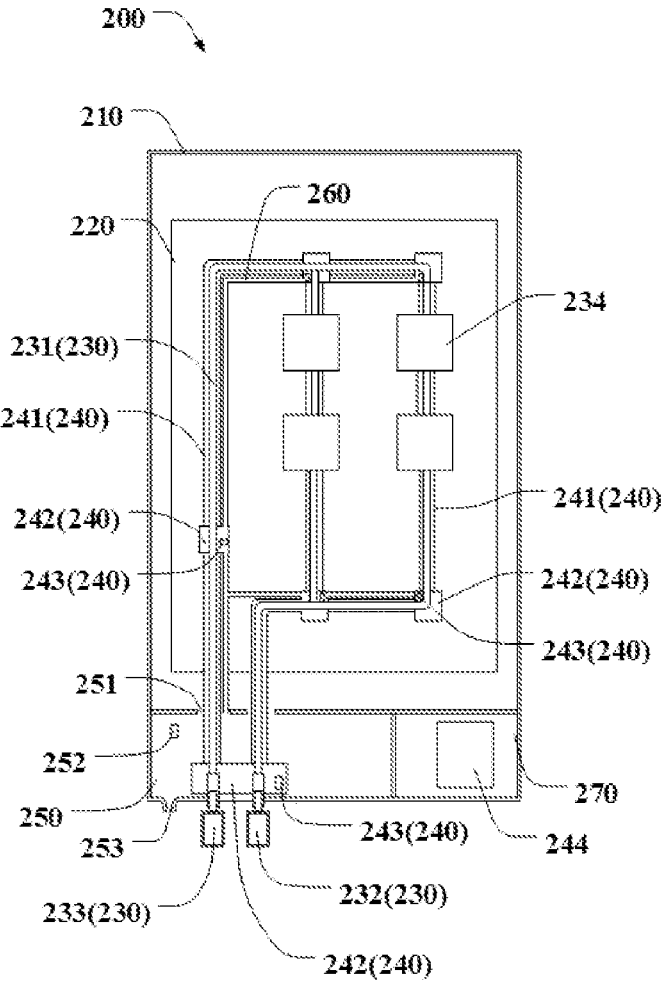
FIG. 5 is a schematic diagram of another structure of a node according to an embodiment of this application.

FIG. 5 is a schematic diagram of another structure of the node according to an embodiment of this application. Refer to FIG. 5. To reduce damage caused by leaked coolant to the circuit board 220, a liquid guide groove 260 may be disposed between the liquid receiving tray 242 and the liquid guide opening 251. Specifically, an opening may be disposed in the liquid receiving tray 242 in a direction towards the liquid guide groove 260. After the liquid receiving tray 242 is fully filled, the leaked coolant flows from the opening into the liquid guide groove 260, flows along the liquid guide groove 260 into the liquid guide opening 251, and enters the liquid isolation area 250. In this solution, the leaked coolant in the liquid receiving tray 242 directly flows into the liquid isolation area 250 through the liquid guide groove 260, so that the coolant does not spread in a large area on the circuit board 220.

Specifically, when the liquid guide groove 260 is disposed, the liquid guide groove 260 may be disposed on the circuit board 220, or an additionally made liquid guide groove 260 structure may be fastened to a surface of the circuit board 220. This is not limited in this application, and may be disposed based on an actual product structure.

Still refer to FIG. 5. When a first liquid leakage sensor 243 is specifically installed, a detection area of the first liquid leakage sensor 243 may be disposed at a connection between the liquid receiving tray 242 and the liquid guide groove 260, for example, a location that is on the liquid receiving tray 242 and that is close to the opening. This can ensure that the first liquid leakage sensor 243 can detect the liquid leakage, and the leaked coolant neither avoids the first liquid leakage sensor 243 nor directly flows away from the liquid guide groove 260. In this way, the liquid leakage monitoring apparatus 240 can work more reliably.

Alternatively, in another embodiment, a liquid guide pipe may further be disposed between the liquid receiving tray 242 and the liquid guide opening 251. In other words, two ends of the liquid guide pipe are respectively connected to the liquid receiving tray 242 and the liquid guide opening 251. In this way, after reaching a specific amount, the leaked coolant in the liquid receiving tray 242 directly flows into the liquid isolation area 250 along the liquid guide pipe. In this solution, a possibility that the leaked coolant flows to the circuit board 220 can be reliably reduced, to reduce impact on the node 200 when the leakage occurs in the liquid cooling heat dissipation apparatus 230.

In a further embodiment, there is an upper cover on the liquid receiving tray 242. In this way, when the leakage occurs in the liquid pipe 231 of the liquid cooling heat dissipation apparatus 230, the leaked coolant may flow into the liquid isolation area 250 along the drainage pipe 241, the liquid receiving tray 242, and the liquid guide pipe in sequence, and does not flow to the circuit board 220 of the node 200. This can better protect the electronic component and store data.

In this embodiment, when the first liquid leakage sensor 243 is installed, the detection area of the first liquid leakage sensor 243 may alternatively be disposed at a connection between the liquid receiving tray 242 and the liquid guide pipe. This can ensure that the first liquid leakage sensor 243 can detect the liquid leakage, and the leaked coolant neither avoids the first liquid leakage sensor 243 nor directly flows away from the liquid guide pipe. In this way, the liquid leakage monitoring apparatus 240 can work more reliably.

Refer to FIG. 5. A second liquid leakage sensor 252 may be further disposed in the liquid isolation area 250. When the leaked coolant flows into the liquid isolation area 250, the second liquid leakage sensor 252 may also detect that there is the leaked coolant in the liquid isolation area 250, and send an alarm signal. This solution can prevent a large loss caused by a failure of processing in time after the liquid pipe 231 leaks because the first liquid leakage sensor 243 in the liquid receiving tray 242 does not work normally due to an error or damage, to improve a protection effect on the node 200 and the electronic device. In addition, it is also convenient for the operator or the system to learn of a current leakage degree and speed of the liquid pipe 231.

The first controller may further be connected to the second liquid leakage sensor, to control, based on the alarm signal sent by the second liquid leakage sensor, the switch valve to close, in other words, cut off coolant supply of the liquid pipe.

Still refer to FIG. 5. The liquid isolation area 250 further includes a liquid outlet 253. After reaching a specific amount, the leaked coolant in the liquid isolation area 250 may flow out of the liquid outlet 253, and leave the node 200. It is unlikely to damage the electronic component of the node 200. In addition, the leaked coolant of the leaked node 200 is discharged in a directional manner, so that the leaked coolant does not flow into another node 200. This can protect the another node 200 and reduce a loss.

Figure 6:
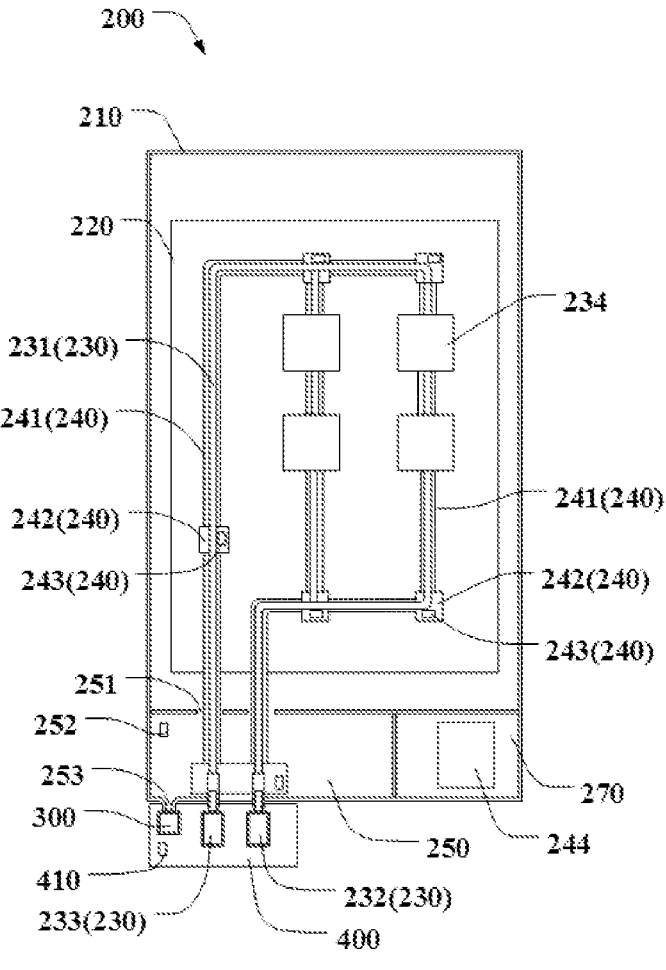
FIG. 6 is a schematic top view of a structure of an electronic device according to an embodiment of this application.
Figure 7:
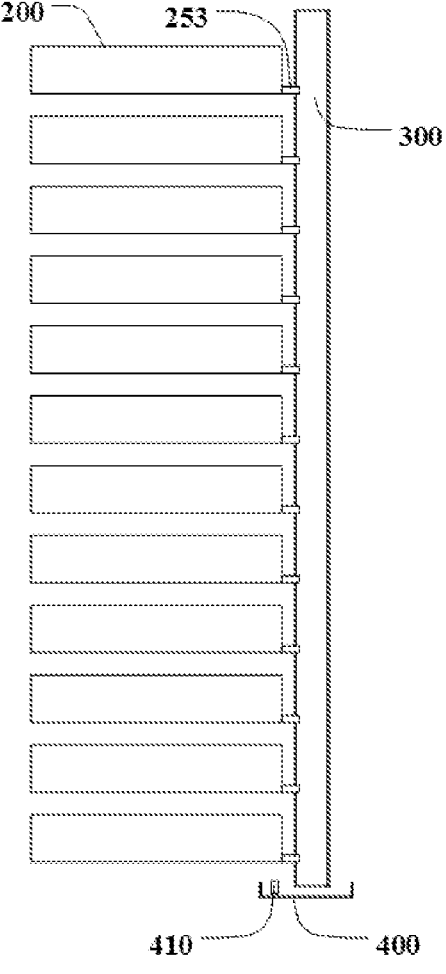
FIG. 7 is a schematic side view of an electronic device according to an embodiment of this application.

FIG. 6 is a schematic top view of a structure of an electronic device according to an embodiment of this application. FIG. 7 is a schematic side view of an electronic device according to an embodiment of this application. As shown in FIG. 6 and FIG. 7, the electronic device may include a liquid discharge pipe 300. A liquid outlet 253 of the liquid isolation area 250 is connected to the liquid discharge pipe 300, so that the leaked coolant of the liquid isolation area 250 may be discharged outside the cabinet body 100 through the liquid discharge pipe 300. In this way, the coolant leaked from the liquid pipe 231 of the liquid cooling heat dissipation apparatus 230 may be quickly discharged. Specifically, a liquid outlet 253 of a liquid isolation area 250 of each node 200 may be connected to the liquid discharge pipe 300. In this solution, the leaked coolant may not flow in the cabinet body 100, and may not damage a node 200 in which leakage does not occur. This can protect another node 200, and reduce a loss caused by leakage of the liquid pipe 231.

Still refer to FIG. 6 and FIG. 7. The electronic device may further include a liquid collection tray 400, and an outlet of the liquid discharge pipe 300 is connected to the liquid collection tray 400. In this case, the leaked coolant of the liquid isolation area 250 flows into the liquid collection tray 400 through the liquid discharge pipe 300, to collect cooling water. In addition, a third liquid leakage sensor 410 is further disposed in the liquid collection tray 400. When detecting the leaked coolant, the third liquid leakage sensor 410 sends an alarm signal. In this solution, the third liquid leakage sensor 410 may be configured to send a supplementary alarm signal. If the first liquid leakage sensor 243 does not send the alarm signal due to an error, damage, or the like, the leakage can be detected and handled in a timely manner when the leakage occurs in the liquid cooling heat dissipation apparatus 230 in the electronic device. This solution can ensure that the electronic device implements multi-level monitoring on the leakage of the liquid cooling heat dissipation apparatus 230.

The electronic device may further include a second controller. The liquid pipe is connected to a switch valve. The second controller is connected to the switch valve and the third liquid leakage sensor. When detecting that there is the leaked coolant, the third liquid leakage sensor sends the alarm signal, and the second controller may control, based on the alarm signal sent by the third liquid leakage sensor, the switch valve to close. In this solution, the second controller may be configured to automatically cut off coolant transmission, to reduce a loss caused by the leakage of the liquid pipe.

The node 200 further includes a liquid leakage protection area 270 and a power board 244. The power board 244 is configured to supply power to the liquid leakage monitoring apparatus 240, and may be specifically configured to supply power to the first liquid leakage sensor 243, the second liquid leakage sensor 252, and the third liquid leakage sensor 410. There is a partition board in the liquid leakage protection area 270, so that the liquid leakage protection area 270 is isolated from another area. The power board 244 is disposed in the liquid leakage protection area 270, so that the power board 244 may be isolated from another area. In this way, even if a large amount of coolant leaks, the power board 244 can still work normally, to ensure that the liquid leakage sensors may work normally and send the alarm signals, so that the system or the operator may obtain a message of the coolant leakage in a timely manner. Certainly, in another embodiment, the third liquid leakage sensor may further be powered by a power board in the cabinet. This is not limited in this application.

In a specific application process, the power board 244 may be configured to supply power only to the liquid leakage monitoring apparatus 240, and may further be configured to supply power to an electronic component on the circuit board 220. This is not specifically limited in this application.

The foregoing descriptions are only specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A node, comprising:
a circuit board, disposed with an electronic component;
a liquid pipe comprising coolant in the liquid pipe, wherein the coolant is used to dissipate heat for the electronic component;
a liquid leakage monitoring apparatus, comprising a drainage pipe, a liquid receiving tray, and a first liquid leakage sensor, wherein the drainage pipe is sleeved outside the liquid pipe, the drainage pipe is connected to the liquid receiving tray and is configured to direct the coolant leaked from the liquid pipe into the liquid receiving tray, the first liquid leakage sensor is disposed in the liquid receiving tray, and in response to at least detecting the leaked coolant in the liquid receiving tray, the first liquid leakage sensor sends an alarm signal; and
a liquid isolation area comprising an opening configured to allow the leaked coolant to flow into the liquid isolation area after the liquid receiving tray is filled.

2. The node according to claim 1, further comprising a liquid leakage protection area, wherein the liquid leakage monitoring apparatus comprises a power board, the power board is configured to supply power to the liquid leakage monitoring apparatus, and the power board is disposed in the liquid leakage protection area.

3. The node according to claim 1, further comprising a first controller, wherein the liquid pipe is connected to a switch valve, and the first controller is connected to the switch valve and the first liquid leakage sensor and is configured to control, based on the alarm signal, the switch valve to close.

4. The node according to claim 1, wherein the alarm signal comprises at least one of a buzzer, an indicator, a pop-up window in a display interface, or a blinking window in a display interface.

5. The node according to claim 1, further comprising: a liquid guide groove disposed between the liquid receiving tray and the liquid guide opening, wherein the leaked coolant in the liquid receiving tray is introduced into the liquid isolation area through the liquid guide groove after the liquid receiving tray is filled.

6. The node according to claim 5, wherein a detection area of the first liquid leakage sensor is arranged at a connection between the liquid receiving tray and the liquid guide groove.

7. The node according to claim 1, further comprising: a liquid guide pipe disposed between the liquid receiving tray and the liquid guide opening, wherein the leaked coolant in the liquid receiving tray is introduced into the liquid isolation area through the liquid guide pipe.

8. The node according to claim 7, further comprising: an upper cover at a top of the liquid receiving tray.

9. The node according to claim 8, wherein a detection area of the first liquid leakage sensor is arranged at a connection between the liquid receiving tray and the liquid guide pipe.

10. The node according to claim 1, wherein the liquid isolation area comprises a liquid outlet, and the leaked coolant in the liquid isolation area flows out through the liquid outlet.

11. The node according to claim 1, wherein a second liquid leakage sensor is disposed in the liquid isolation area, and in response to at least detecting that there is leaked coolant in the liquid isolation area, the second liquid leakage sensor sends an alarm signal.

12. The node according to claim 1, wherein the liquid receiving tray is either disposed at a corner of the drainage pipe, or disposed at a connection between two adjacent drainage pipes, or both.

13. The node according to claim 1, wherein the liquid leakage monitoring apparatus comprises a plurality of liquid receiving trays comprising two adjacent liquid receiving trays, and a drainage pipe of a specified length is connected between the two adjacent liquid receiving trays.

14. An electronic device, comprising a cabinet body and a node, wherein the node is disposed in the cabinet body and comprises:

a circuit board, disposed with an electronic component;

a liquid pipe comprising coolant in the liquid pipe, wherein the coolant is used to dissipate heat for the electronic component;

a liquid leakage monitoring apparatus, comprising a drainage pipe, a liquid receiving tray, and a first liquid leakage sensor, wherein the drainage pipe is sleeved outside the liquid pipe, the drainage pipe is connected to the liquid receiving tray and is configured to direct the coolant leaked from the liquid pipe into the liquid receiving tray, the first liquid leakage sensor is disposed in the liquid receiving tray, and in response to at least detecting the leaked coolant in the liquid receiving tray, the first liquid leakage sensor sends an alarm signal; and a liquid isolation area comprising an opening configured to allow the leaked coolant to flow into the liquid isolation area after the liquid receiving tray is filled.

15. The electronic device according to claim 14, wherein the node further comprising a liquid leakage protection area, wherein the liquid leakage monitoring apparatus comprises a power board, the power board is configured to supply power to the liquid leakage monitoring apparatus, and the power board is disposed in the liquid leakage protection area.

16. The electronic device according to claim 14, wherein the node further comprising a first controller, wherein the liquid pipe is connected to a switch valve, and the first controller is connected to the switch valve and the first liquid leakage sensor and is configured to control, based on the alarm signal, the switch valve to close.

17. The electronic device according to claim 14, comprising a liquid discharge pipe, wherein the liquid isolation area is located at a side edge of the node and the liquid isolation area comprises a liquid outlet connected to the liquid discharge pipe.

18. The electronic device according to claim 17, wherein the liquid discharge pipe is connected to a liquid collection tray, a third liquid leakage sensor is disposed in the liquid collection tray, and in response to at least detecting that there is leaked coolant in the liquid collection tray, the third liquid leakage sensor sends an alarm signal.

19. The electronic device according to claim 18, further comprising a second controller, wherein a liquid pipe is connected to a switch valve, and the second controller is connected to the switch valve and the third liquid leakage sensor and is configured to control, based on the alarm signal, the switch valve to close.

20. The electronic device according to claim 14, wherein the node further comprising: a liquid guide groove disposed between the liquid receiving tray and the liquid guide opening, wherein the leaked coolant in the liquid receiving tray is introduced into the liquid isolation area through the liquid guide groove after the liquid receiving tray is filled.

* * * * *